United States Patent
Vashchenko et al.

(10) Patent No.: US 6,498,373 B1
(45) Date of Patent: Dec. 24, 2002

(54) ESD PROTECTION CMOS STRUCTURE WITH DYNAMIC SUBSTRATE CONTROL

(76) Inventors: Vladislav Vashchenko, 39939 Stevenson Cmn., #2064, Fremont, CA (US) 94538; Peter Hopper, 4327 Verdigris Cir., San Jose, CA (US) 95134

( * ) Notice: Subject to any disclaimer, the term of this patent is extended or adjusted under 35 U.S.C. 154(b) by 0 days.

(21) Appl. No.: 09/888,248

(22) Filed: Jun. 22, 2001

(51) Int. Cl.$^7$ .............................................. H01L 23/62
(52) U.S. Cl. ........................ 257/360; 257/355; 257/356; 257/362
(58) Field of Search ................................ 257/355, 356, 257/360, 361, 362

(56) References Cited

U.S. PATENT DOCUMENTS

| | | | | |
|---|---|---|---|---|
| 6,177,324 B1 | * | 1/2001 | Song et al. | 438/307 |
| 6,285,062 B1 | * | 9/2001 | Marr | 257/361 |
| 6,316,805 B1 | * | 11/2001 | Lin et al. | 257/328 |
| 6,329,253 B1 | * | 12/2001 | Song et al. | 438/281 |

* cited by examiner

Primary Examiner—Ngân V. Ngô
(74) Attorney, Agent, or Firm—Jurgen Vollrath

(57) ABSTRACT

In an ESD protection device and method, greater stability is achieved in a MOS device by replacing the thin gate oxide with a shallow trench isolation region, and breakdown voltages are reduced by providing for dynamic substrate control. In the case of NMOS, the dynamic substrate control also has the effect of reducing triggering voltage.

13 Claims, 5 Drawing Sheets

ESD PROTECTION CMOS STRUCTURE WITH DYNAMIC SUBSTRATE CONTROL

FIELD OF THE INVENTION

The invention relates to an ESD protection structure. In particular, it relates to a protection structure using a MOS device.

BACKGROUND OF THE INVENTION

CMOS devices have traditionally been used for ESD protection. A typical CMOS device is illustrated in FIG. 1 in which the polygate can be used as a self-aligned mask to produce a small drain-source spacing between the drain 14 and the source 16. The gate 10 which is of the order of 0.18 μm in the case of 0.18 μm technology allows a drain-source spacing of the order of 0.1 μm to be achieved. However the snapback triggering voltage is typically 2 to 3 times higher than the operating power supply voltage. Traditionally, in order to reduce the triggering voltage, gate potential has been appropriately controlled. However, this produces only about a 20% reduction.

A schematic representation of the structure of FIG. 1 is shown in FIG. 2 which defines the gap 12 in the p-well 18. The gap 12 extends between a lightly doped drain region 20 of the drain 14, and a lightly doped source region 22 of the source 16. As is shown in the electric field versus x-dimension graph in FIG. 2B, the electric field gradually increases from the source to the drain. Furthermore, the curves 24 become ever steeper as the voltage across the drain and source is increased. The effect of this is that hole concentration at the drain gradually increases with increasing electric field as shown in FIG. 2C. At the same time, the electron concentration at the source gradually increases. The breakdown voltage avalanche effect causes the holes to be swept across from the drain to the source and causes electron injection from the source to the drain. As can be seen in FIG. 2A, some of the holes are diverted into the gate 10 which is separated from the p-well only by a thin gate oxide 30. As mentioned above, the gate coupling effect can be adjusted by adjusting the voltage on the gate thereby allowing the triggering voltage to be further reduced by limiting the number of holes that are diverted into the gate. The snap back triggering characteristic of the NMOS device of FIGS. 1 and 2, is used to switch the device into a high conductivity state with avalanche injection at some critical level of drain-source breakdown.

The breakdown characteristics of the NMOS device described above are illustrated in FIG. 3 in which the drain current versus drain-source voltage characteristics are shown. As the drain-source voltage (Vds) increases, drain current (Id) remain substantially unchanged until the breakdown voltage (Vbr) 32 is reached. This causes rapid increase in Id. Eventually the hole concentration and electron concentration at the drain and source, respectively, is reversed, as defined by the triggering voltage (Vtr) 34. At this point, even with reduced Vds, the drain current continues to increase thus defining the snap back effect.

A drawback of these prior art devices, when used as ESD protection solutions, is that the gate oxide is too thin to provide reliable operation. One solution adopted is to split the gate voltage, thereby keeping the voltage below critical values. The present invention seeks to provide a more robust solution to the use of MOS devices used as ESD protection clamps.

SUMMARY OF THE INVENTION

According to the invention, there is provided an ESD protection clamp making use of a modified MOS device, and preferably making use of a modified NMOS snap back structure. The gate oxide is replaced by a composite-to-composite spacing in the form of a shallow trench isolation (STI) region which is used in conjunction with dynamic substrate control using a sub-circuit to adjust the substrate potential and thus reduce the triggering voltage. Without the dynamic substrate control, the modified NMOS structure would display high breakdown voltages due to the substantial spacing caused by the STI which would make the device unsuitable for ESD protection. By way of comparison, a conventional NMOS snap back structure making use of the polygate as a self-aligned mask which is separated from the p-well by a thin gate oxide, displays typical drain-source spacing of approximately 0.2 μm for a 0.5 μm gate. In contrast, a modified structure making use of STI would display an oxide isolation region between the drain and the source of approximately 0.35 μm width.

The present invention therefore replaces the dynamic gate coupling effect of the prior art with a modified structure and the use of substrate coupling in order to reduce the breakdown and triggering voltages of the modified structure. The modified structure of the present invention has the advantage of avoiding gate oxide breakdown. It provides for better heat dissipation and reduces hot carrier degradation, an effect evident in NMOS devices over a long period of time. The effect of hot current degradation is that current drain-source voltage gradually increases due to degradation of the device.

Further according to the invention, there is provided a method of providing ESD protection comprising providing a modified MOS device in which the gate oxide has been eliminated and a STI region introduced to provide a composite-to-composite spacing, and increasing the substrate voltage to reduce the triggering voltage of the structure.

Still further according to the invention, there is provided a method of providing ESD protection comprising providing a modified MOS structure in which the gate oxide has been eliminated and a STI region introduced between the drain and the source of the structure, and injecting carriers into the substrate to reduce the breakdown voltage.

Further according to the invention, in a MOS device having a drain and a source separated by a STI region, triggering voltage is reduced by means of dynamic substrate control, which includes injecting carriers into the substrate or increasing the voltage of the substrate.

DETAILED DESCRIPTION OF THE INVENTION

Figure 1:
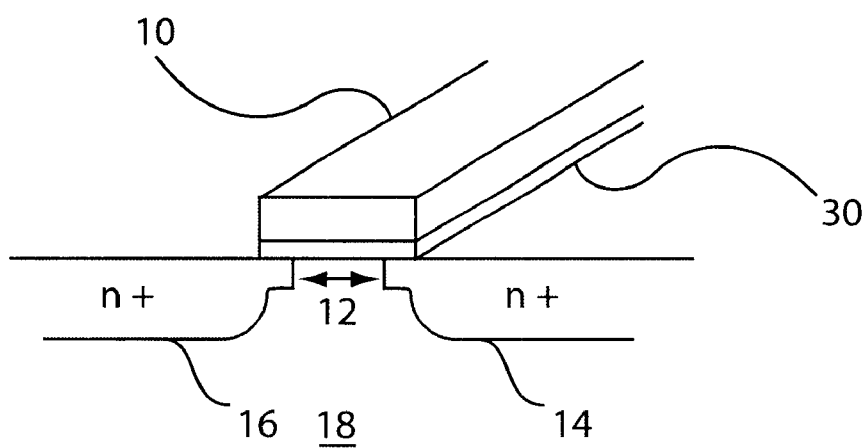
FIG. 1 is a three-dimensional representation of a conventional NMOS device.
Figure 2A:
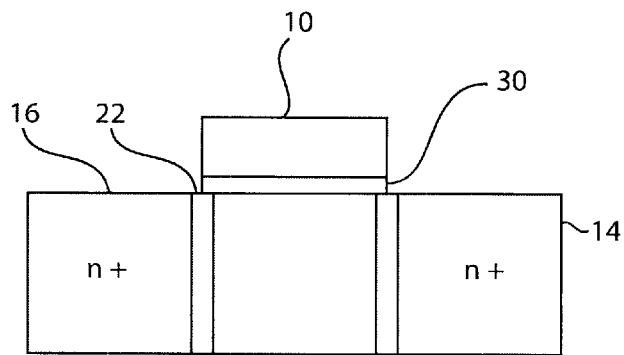
FIG. 2A is a schematic representation of the device of FIG. 1.
Figure 2B:
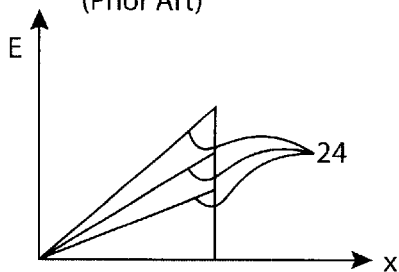
FIG 2B shows graphs of electric field distribution across the p-well of the device of FIG. 1.
Figure 2C:
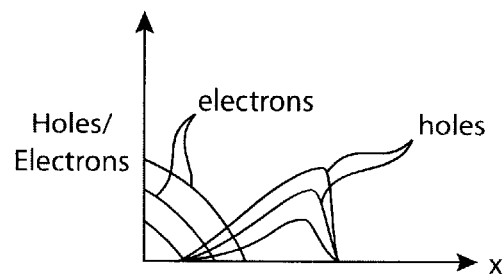
FIG 2C shows graphs of carrier distribution across the p-well of the device of FIG. 1.
Figure 3:
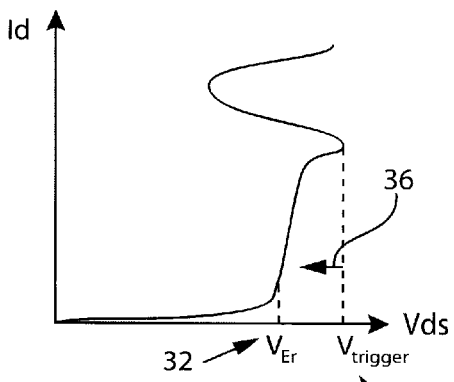
FIG. 3 is a drain current versus drain-source voltage curve of a typical NMOS device.
Figure 4:
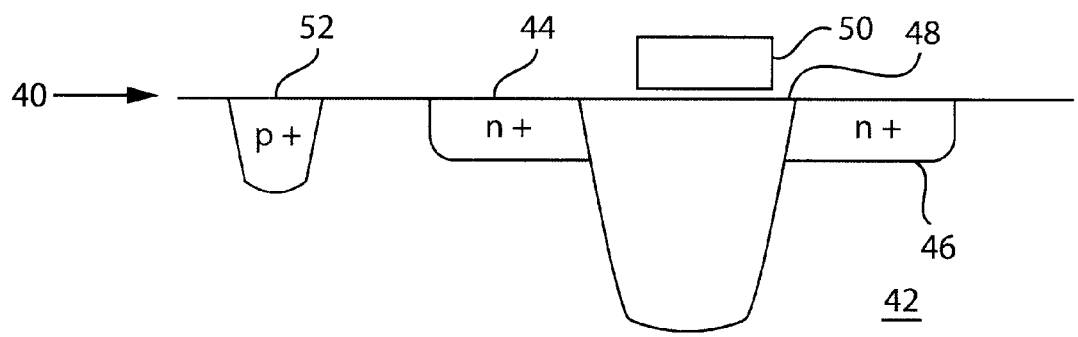
FIG. 4 is a sectional representation of a modified NMOS structure of the invention.

FIG. 4 illustrates one embodiment of the invention. It shows a section through a modified NMOS device of the invention. The device 40 comprises a p-well 42 having a n+ source region 44 and a n+ drain region 46 separated by a shallow trench isolation (STI) region 48 which is located below a gate 50. The device 40 also includes a p+ substrate region 52. In the absence of an external voltage supplied to the p+ substrate 52, holes from the drain region 46 are swept into the p-well 42. Due to the wide STI region 48, only a few of the holes reach the source 44. This manifests itself in a high triggering voltage, since a high voltage is required to provide the requisite current concentration at the junction between the source 44 and the p-well 42. However, holes are also swept into the p+ substrate region 52. The invention therefore proposes dynamic substrate control by increasing the potential of the substrate region 52. This has a dual effect. In the first instance even a small voltage on the p+ substrate region 52 changes the potential between the substrate region 52 and the source 44 to reduce the number of holes being diverted to the substrate 52 and thus reduce the number of holes required to achieve triggering of the device. Referring to FIG. 3, this effect can be shown by the triggering voltage 34 moving to the left as indicated by the arrow 36. Furthermore, as the voltage on the p+ substrate 52 is increased, additional holes are injected. By pumping holes into the substrate the breakdown voltage and triggering voltage are further reduced.

Figure 5:
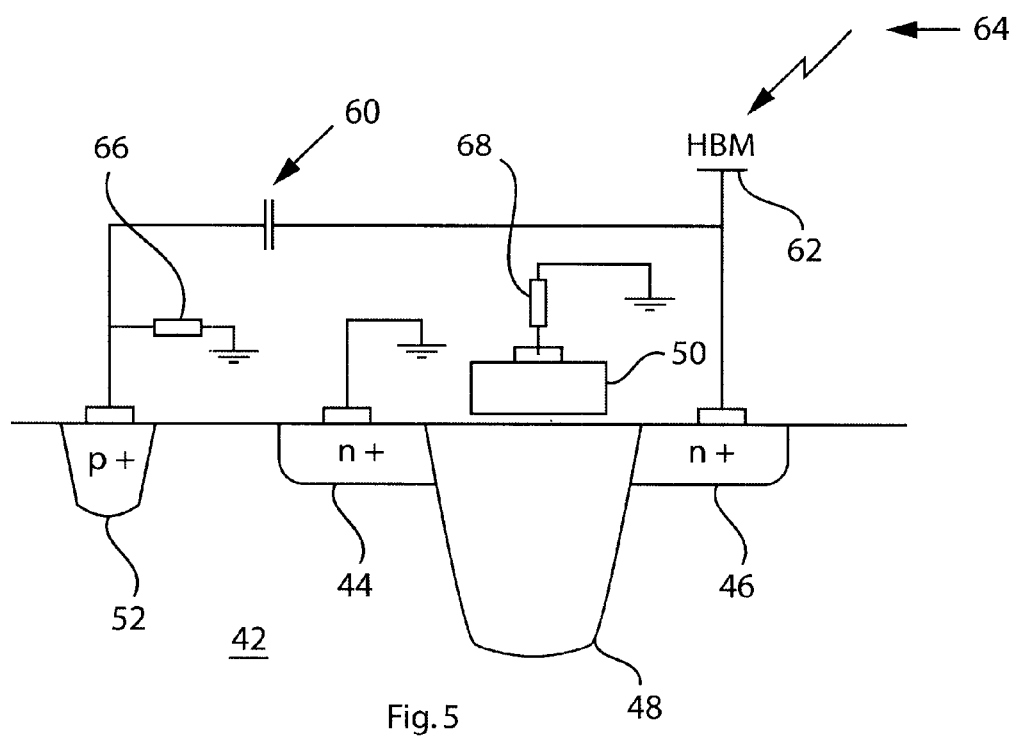
FIG. 5 is a sectional representation of a NMOS device of the invention showing an embodiment of a sub-circuit of the invention.
Figure 6:
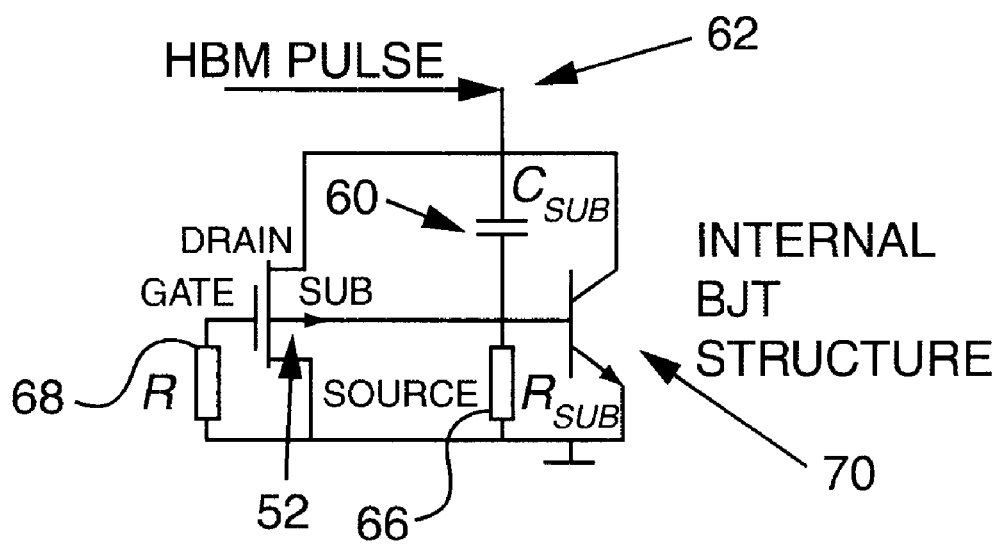
FIG. 6 is a schematic circuit diagram showing the modified NMOS device and sub-circuit illustrated in FIG. 5.

One embodiment of the invention, showing a dynamic substrate control, is illustrated in FIG. 5. For purposes of convenience the same elements found in FIG. 4 are given like reference numerals in FIG. 5. The plus substrate region 52 is connected via a capacitor 60 to the input 62 requiring ESD protection. A human body model (HBM) pulse 64 is shown being applied to the input 62. The substrate region 52 is also connected to ground via a resistor 66. Its source region 44, is connected directly to ground while the drain region 46 is connected to the input 62. The gate 50 is connected to ground through a resistor 68. The effect of the capacitor 60 is to dynamically control the voltage in substrate region 52 by connecting the substrate region 52 to the input 62. As discussed above, this pumps carriers into the p well 42, thereby increasing the number of carriers in the junction region between the p-well 42 and the source 44 to reduce the breakdown and triggering voltages. The device and sub-circuit of FIG. 5 is illustrated schematically in FIG. 6. As is shown in FIG. 6, the capacitor 60 is connected between the input 62 and the substrate 52, and the resistor 66 is connected between the substrate 52 and ground. The internal BJT structure 70, which causes the snap back triggering characteristics of the NMOS device, is also shown schematically.

Figure 7:
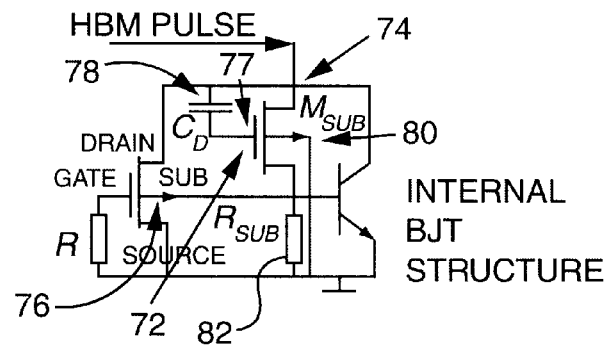
FIG. 7 is a schematic circuit diagram of another embodiment of the invention.

FIG. 7 shows a circuit diagram of another embodiment of the invention. This embodiment the sub-circuit which performs the dynamic substrate control, takes the form of a NMOS driver 72 coupled between an input 74 and the substrate 76. The gate 77 of the NMOS driver is also connected to the input 74 via a capacitor 78. The substrate 80 of the NMOS driver is connected to ground. As in the previous circuit, a resistor 82 is connected between the substrate 76 and ground. The voltage pulse applied to the input 74 is fed into the gate 77 of the NMOS driver 72 via the capacitor 78 to trigger the NMOS driver to inject current into the substrate 76.

Figure 8:
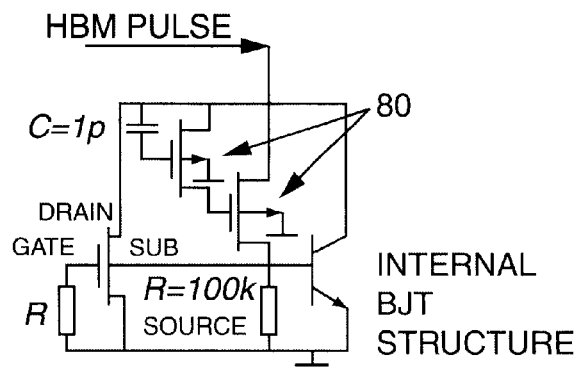
FIG. 8 is a circuit diagram of yet another embodiment of the invention.

Another embodiment of the invention is shown in FIG. 8. Several NMOS drivers 80 are cascaded together.

Figure 9:
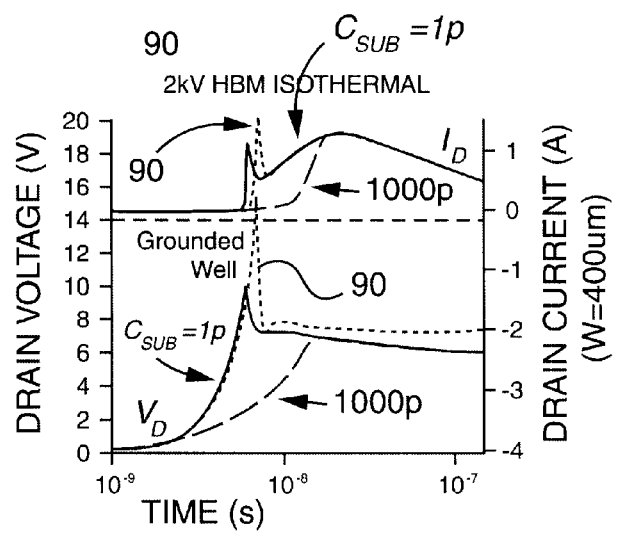
FIG. 9 is a set of graphs showing drain voltage and drain current changing with time for various capacitor sizes of the FIG. 6 embodiment.

The effects of dynamic substrate control are shown in FIG. 9. In FIG. 9, increasing the capacitor 60 in the embodiment of FIG. 6 is shown to produce reduced drain voltage and drain current and correspondingly reduced breakdown voltage. In particular, these values are significantly lower than those for a conventional grounded well device as shown by the curves 90 in FIG. 9.

While the invention was described above specifically using an NMOS snapback structure, the use of dynamic substrate control would apply also to PMOS devices. Although a PMOS device does not display the snapback characteristics of an NMOS device and therefore does not have a triggering voltage as illustrated in FIG. 3, it does display a certain breakdown voltage characteristic which can be adjusted using dynamic substrate control. This would be achieved by forming a n+ region next to the p+ drain of the PMOS device and appropriately reducing the voltage to the n+ region to reduce the number of electrons diverted into the substrate.

It will be appreciated that the circuits illustrated are by way of example only and that any suitable sub-circuit can be devised to achieve the effect of reducing breakdown voltage and triggering voltage in a device of the invention.

What is claimed is:

1. An ESD protection clamp for protecting the input of a circuit, comprising
   a modified MOS structure wherein the drain and source are separated by a STI region,
   a highly doped region formed in the substrate in which the drain and source are formed, and having a polarity opposite to that of the drain and source, and
   a sub-circuit connected to the highly doped region for reducing the triggering voltage or break-down voltage of the structure.

2. An ESD protection clamp for protecting the input of a circuit, comprising
   a MOS structure wherein the drain and source are separated by a STI region, and
   an external sub-circuit connected to the substrate in which the drain and source of the MOS structure are formed, for reducing the triggering voltage or break-down voltage of the structure.

3. An ESD protection clamp of claim 2, wherein the sub-circuit is configured to perform at least one of injecting carriers into the substrate of the MOS structure, and varying the voltage to the substrate.

4. An ESD protection clamp of claim 2, wherein the MOS structure includes a highly doped region, formed in the substrate in which the drain and source are formed, and having a polarity opposite to that of the drain and source.

5. An ESD protection clamp of claim 2, wherein the sub-circuit comprises at least one capacitor between the highly doped region and the input of the circuit.

6. An ESD protection clamp of claim 4, wherein the MOS structure is a NMOS structure and the highly doped region is a p+ region.

7. An ESD protection clamp of claim 2, wherein the sub-circuit comprises at least one MOS device between the highly doped region and the input of the circuit for controlling the well or substrate potential, and at least one capacitor for triggering said at least one MOS device.

8. An ESD protection clamp of claim 1, wherein the sub-circuit injects carriers into the substrate of the modified MOS structure or varies the voltage to the substrate.

9. An ESD protection clamp of claim 1, wherein the modified MOS structure is a modified NMOS device having a highly doped p+ region, and the sub-circuit increases the voltage to the highly doped p+ region.

10. An ESD protection clamp of claim 1, wherein the sub-circuit comprises at least one capacitor between the highly doped region and the input of the circuit.

11. An ESD protection clamp of claim 9, wherein the sub-circuit comprises at least one capacitor between the highly doped p+ region and the input of the circuit.

12. An ESD protection clamp of claim 1, wherein the sub-circuit comprises at least one MOS device between the highly doped region and the input of the circuit for controlling the substrate potential, and at least one capacitor for triggering said at least one MOS device.

13. An ESD protection clamp of claim 9, wherein the sub-circuit comprises at least one MOS device between the highly doped p+ region and the input of the circuit for controlling the substrate potential, and at least one capacitor for triggering said at least one MOS device.

* * * * *